United States Patent [19]

Leger et al.

[11] Patent Number: 5,027,359
[45] Date of Patent: Jun. 25, 1991

[54] MINIATURE TALBOT CAVITY FOR LATERAL MODE CONTROL OF LASER ARRAY

[75] Inventors: James R. Leger, Groton; Gary J. Swanson, Lexington, both of Mass.

[73] Assignee: Massachusetts Institute of Technology, Cambridge, Mass.

[21] Appl. No.: 428,829

[22] Filed: Oct. 30, 1989

[51] Int. Cl.$^5$ .............................................. H01S 3/098
[52] U.S. Cl. .......................................... 372/18; 372/19; 372/95; 372/99; 372/101; 372/108; 350/167.16; 350/167
[58] Field of Search ....................... 372/18, 19, 95, 97, 372/98, 99, 101, 108; 350/162.16, 162.17, 167

[56] References Cited

U.S. PATENT DOCUMENTS

| 4,426,707 | 1/1984 | Martin et al. | 372/95 |
| 4,649,351 | 3/1987 | Veldkamp et al. | 330/4.3 |
| 4,764,929 | 8/1988 | Thaniyavarn | 372/18 |
| 4,813,762 | 3/1989 | Leger et al. | 350/162.16 |

OTHER PUBLICATIONS

Leger, James R., "Lateral Mode Control of an AlGaAs Laser Array in a Talbot Cavity", Appl. Phys. Lett. 55, (4), pp. 334–336, Jul. 24 1989.
Leger, J. R. and Griswold, M. P., "Binary-Optics Miniature Talbot Cavities for Laser Beam Addition", Appl. Phys. Lett. 56 (1), pp. 4–6, Jan. 1 1990.
Leger, James R., Scott, Miles L. and Veldkamp, Wilfrid B., "Coherent Addition of AlGaAs Lasers Using Microlenses and Diffractive Coupling", Appl. Phys. Lett., 52, pp. 1771–1773, May 23, 1988.
Leger, J. R. and Holz, M., "Binary Optical Elements for Coherent Addition of Laser Diodes", LEOS Annual Meeting, Santa Clara, Calif., Nov. 2–4, 1988.
Wang, Shyh, "In-Phase Locking in Diffraction-Coupled Phased-Array Diode Lasers", Appl. Phys. Lett., 48, pp. 1770–1772, Jun. 30, 1986.
Katz et al., "Diffraction Coupled Phase-Locked Semiconductor Laser Array", Appl. Phys. Lett., 42, pp. 554–556, Apr. 1, 1983.
Chen, T. R. et al., "Phase-Locked InGaAsP Laser Array with Diffraction Coupling", Appl. Phys. Lett., 43, pp. 136–137, Jul. 15, 1983.
Glova, A. F., et al., "Phase Locking of a Two-Dimensional Array of $CO_2$ Waveguide Lasers", Sov. Tech. Phys. Lett., 11, pp. 102–103, (1985).
Darznek, S. A. et al., "Investigation of a Multielement Electron-Beam-Pumped Semiconductor Laser with an External Mirror", Sov. J. Quant. Electron., 4, pp. 1272–1274, (1975).
Basov et al., "Synchronization of Oscillations in a Semiconducting Laser Having Several p-n Junctions", Soviet Physics-Solid State 7, pp. 275–276, (1965).
Roychoudhuri, C. et al., "Review of Compant Cavities for Coherent Array Lasers", LEOS Annual Meeting, Santa Clara, Calif., Nov. 2–4 1988.
Golubentsev, A. A., et al., "Theory of Phase Locking of an Array of Lasers", Sov. Phys. JETP, 66, pp. 676–682, (1987).
Antyukhov, V. V., et al., "Effective Phase Locking of an Array of Lasers", Pis'ma Ph. Eksp. Theor. Fiz., 44, 63–65 (1986).
Shiono, Teruhiro et al., "Rectangular-Apertured Micro-Fresnel Lens Arrays Fabricated by Electron-Beam Lithography", Applied Optics, 26, pp. 587–591, (1987).

Primary Examiner—Frank Gonzalez
Assistant Examiner—Galen J. Hansen
Attorney, Agent, or Firm—Choate, Hall & Stewart

[57] ABSTRACT

An apparatus for coherent beam combining of lasers and for lateral mode control is disclosed, comprising a miniature Talbot cavity having at least a first and second surface. The first surface is to receive light from said lasers, and the second surface contains a reflecting mirror. In one embodiment, the mirror spaced apart from said first surface by a distance $Z = nd^2/\lambda$ where n is a nonnegative integer, $\lambda$ is the laser wavelength, and d is the laser aperture spacing. In this embodiment, the mirror is divided into reflecting and non-reflecting portions, the reflecting portions patterned to reflect only that portion of the light from said lasers having a half-period shift corresponding to a fundamental lateral mode. In another embodiment, the mirror is spaced apart from the first surface by a distance Z, such that $nd^2/\lambda < Z < (n+1)d^2/\lambda$, where n is a nonnegative integer, $\lambda$ is the laser wavelength, and d is the laser aperture spacing. In both embodiments, a lenslet array may be place to receive the light from the lasers, the lenslet array being separated from the mirror by the distance Z.

23 Claims, 7 Drawing Sheets

MINIATURE TALBOT CAVITY FOR LATERAL MODE CONTROL OF LASER ARRAY

The government has rights in this invention pursuant to contract number F19682-85-C-0002 awarded by the Department of the Air Force.

BACKGROUND OF THE INVENTION

This invention relates to combining plural laser beams coherently, and most particularly to devices using the Talbot effect for coherent combining.

Linear arrays of lasers have been developed that produce higher power by combining many individual lasers. Monolithic surface emitting geometries allow laser arrays to be constructed in two dimensions as well. In addition to high power, however, many applications also require a source with high brightness, or power per unit area per unit solid angle. High brightness requires mutual coherence among the individual lasers. In addition, the individual beams must be combined to produce a single-lobed, far-field pattern with negligible side lobes.

One method of meeting these criteria is by use of the Talbot effect. The Talbot effect refers to the self-imaging properties of periodic structures which can be used to establish coherence across an array of semiconductor lasers. The Talbot effect, using diffractive coupling, produces an image without the aid of lenses, and makes possible a very compact external cavity for coherent beam addition. Diffractive coupling is used to establish mutual coherence across a laser array. The light from a single lasing aperture diffracts into adjacent apertures to provide the necessary coupling. This technique allows the lasers to be separated by large distances, making heat removal easier, and applies to both one- and two-dimensional laser arrays. An apparatus using this technique is disclosed in Leger et al., U.S. Pat. No. 4,813,762, which is incorporated herein by reference.

Also known is that a coherent laser array is capable of lasing in at least two different lateral modes of operation: fundamental mode and highest-order mode. Arrays lasing in highest-order mode produce double-lobed far-field diffraction patterns, while those lasing in fundamental mode produce a single-lobed pattern. FIG. 5 demonstrates an example of a single-lobed far-field pattern associated with a laser operating in fundamental mode. The single lobe demonstrates a concentration of lasing power on-axis. Contrasted with this is FIG. 11, which demonstrates a double-lobed pattern. Rather than concentrating lasing power to a single on-axis lobe, the power is split into two separate lobes. Since most applications require a single intense spot in the far field, it is preferred that a high-power laser array lase in fundamental mode.

SUMMARY OF THE INVENTION

One aspect of the apparatus according to the invention includes a miniature Talbot cavity comprising at least a first and second surface. The first surface is positioned to receive light from the lasers. The second surface contains a reflecting mirror, spaced apart from the first surface by a distance $Z = nd^2/\lambda$ where n is a nonnegative integer, $\lambda$ is the laser wavelength, and d is the laser aperture spacing. The mirror is divided into reflecting and non-reflecting portions, the reflecting portions patterned to reflect only that portion of the light from the lasers having a half period shift corresponding to a fundamental lateral mode. In one embodiment of this aspect of the invention, a lenslet array is etched on the first surface, separated from the mirror by the distance Z, for receiving the light from the lasers. In another embodiment, a lenslet array external to the cavity is added. Each of the lenses in the lenslet array may be a diffractive lens, and may include laser wavefront aberration correction, in which case the lenslets may further comprise elliptical Fresnel zone patterns for astigmatic correction. The lens may be a multistep diffractive lens. In one embodiment, the multistep lens included four steps. The laser array may be either one or two dimensional. In the one-dimensional case, the second surface may be of cylindrical shape, whereby the mirror is also cylindrical. The radius of curvature of the cylindrical shape should be chosen so as to focus light normal to the laser array back into the array. In one embodiment of the two-dimensional case, the ratio of the square of the laser spacings in the two dimensions may form a rational number expressed by the ratio of two integers. In another embodiment of the two-dimensional case, the laser spacings in the two dimensions are integer multiples of one another.

In one embodiment of this aspect of the invention, the non-reflecting portions of the mirror may be adapted to permit transmission of the disfavored non-reflected light. In an alternate embodiment, the non-reflecting portions are adapted to absorb the non-reflected light.

Another aspect of the apparatus according to the invention includes a miniature Talbot cavity comprising at least a first and second surface. The first surface is positioned to receive light from the lasers. The second surface contains a reflecting mirror, spaced apart from the first surface by a distance Z, such that $nd^2/\lambda < Z < (n+1)d^2/\lambda$ where n is a nonnegative integer, $\lambda$ is the laser wavelength, and d is the laser aperture spacing. In one embodiment of this aspect of the invention, a lenslet array is etched on the first surface, separated from the mirror by the distance Z, for receiving the light from the lasers. In another embodiment, a lenslet array external to the cavity is added. Each of the lenses in the lenslet array may be a diffractive lens, and may include laser wavefront aberration correction, in which case the lenslets may further comprise elliptical Fresnel zone patterns for astigmatic correction. The lens may be a multistep diffractive lens. In one embodiment, the multistep lens included four steps. The laser array may be either one or two dimensional. In the one-dimensional case, the second surface may be of cylindrical shape, whereby the mirror is also cylindrical. The radius of curvature of the cylindrical shape should be chosen so as to focus light normal to the laser array back into the array.

In one embodiment of this aspect of the invention, the mirror is adapted to include a mode correction phase plate to convert a far-field diffraction pattern from that of a highest-order lateral mode to that of a fundamental lateral mode. The phase plate may be deposited on the exterior second surface of the optical element. The phase plate may comprise a single rectangular pattern for each of the lasers, where the pattern thickness adjusts the phases of alternate laser apertures to result in a uniform phase output.

In another embodiment of this aspect of the invention, the distance Z is chosen such that a threshold for laser operation in fundamental lateral mode is lower than a threshold for operation in highest-order mode, whereby no phase correction plate is needed.

DESCRIPTION OF THE PREFERRED EMBODIMENTS

A

Experiment

First, we briefly describe the experiments leading to the conclusion that, under the Talbot effect, specific lateral modes can be induced by adjusting the length of the external cavity.

Figure 1:
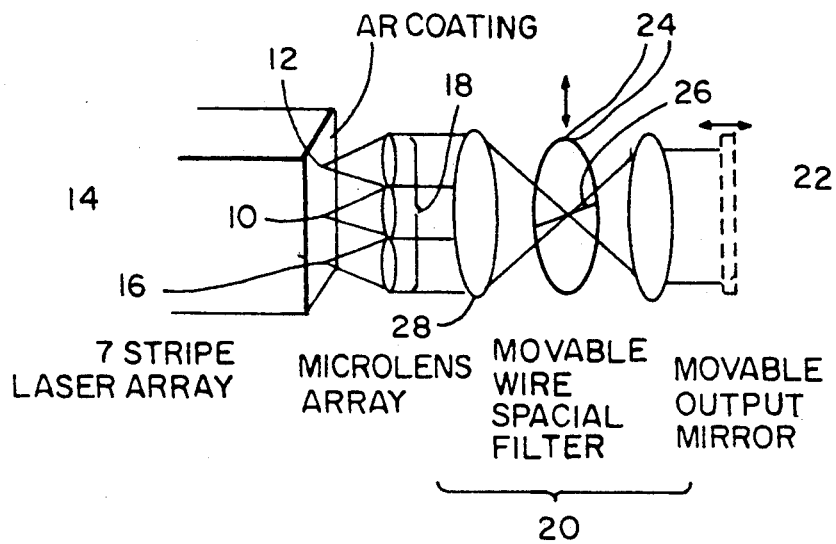
FIG. 1 is a diagrammatic view of the experimental laser beam combining system used to establish that the operating lateral mode may be controlled using the Talbot effect.

An antireflection-coated laser diode array was placed in the external cavity shown in FIG. 1. The array 10 was custom fabricated by Spectra Diode Laboratories and consisted of seven lasers, e.g. 12, 14, and 16, on 50 $\mu m$ centers. No mutual coherence was observed between any of the lasers. An array of anamorphic microlenses 18 collimated the lasers and an afocal imaging system 20 produced an image of the microlens array at the movable flat output mirror 22. A spatial filter 24, consisting of a thin wire 26, was placed in the back focal plane of the first lens 28 to select a specific lateral mode. When the wire 26 blocked the on-axis order, the array 10 was forced to lase in the highest-order lateral mode. By repositioning the wire to block the highest-order mode, the fundamental mode could be excited.

Figure 2:
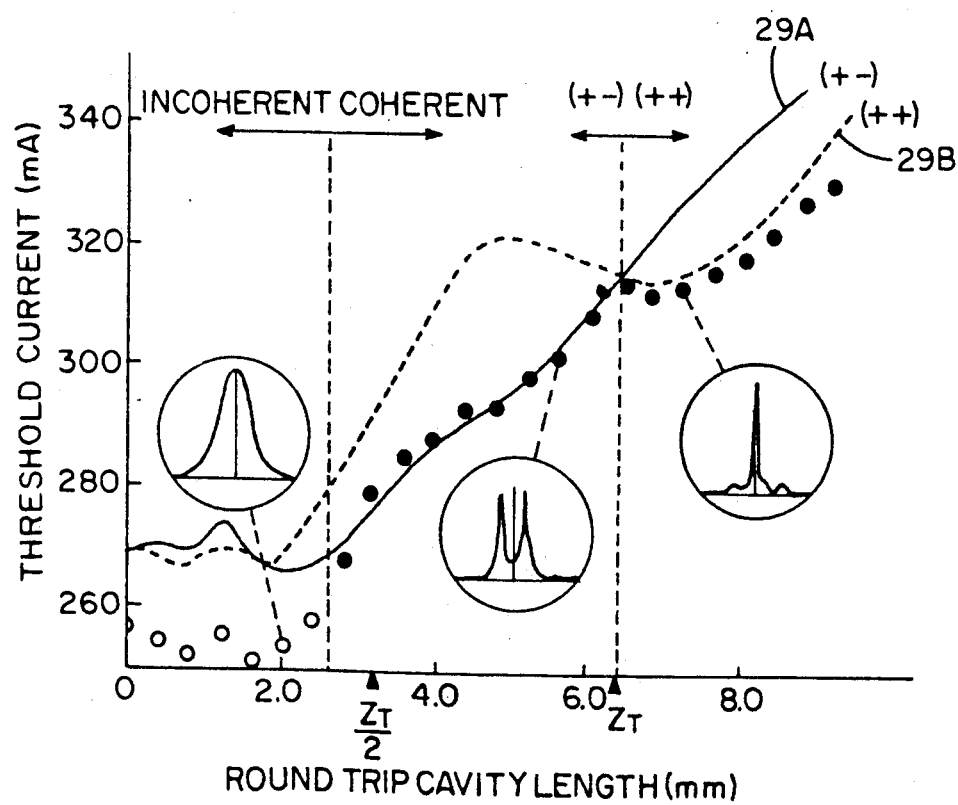
FIG. 2 is a graph of threshold current vs. round trip cavity length, showing the bias of a Talbot cavity for either fundamental mode or highest-order mode at given lengths.

The flat output mirror 22 could be positioned at various distances from the image of the array. With the spatial filter 24 present to select a particular lateral mode, the lasing threshold was measured as a function of output mirror position. A plot of the result is shown in FIG. 2 for both the fundamental mode 29B (dashed line) and highest-order mode 29A (solid line).

The spatial filter was then removed and the new threshold of the array was noted, as well as the far-field pattern. Specific far-field patterns were associated with three regions of round trip cavity length (l). In the first region (l<2.5 mm), the diffractive coupling was not sufficient to lock the lasers, and the diffraction pattern consisted of a single wide peak from the incoherent sum of individual lasers. In the second region (2.5 mm<l<6.2 mm), the array became phase locked in the highest-order mode. These thresholds (dots) matched the thresholds for the induced highest-order mode (solid line). In the third region (>6.2 mm), the array lased in the fundamental mode. The transition occurred where the two modal threshold curves crossed. This time, the unfiltered thresholds (dots) were close to the thresholds of the induced fundamental mode (dashed line).

B

Theory

The modal selectivity of the cavity can be explained by the theory of Talbot self-imaging, if we approximate the array as infinite in length. It has been shown that the near field pattern from the fundamental lateral mode of an infinite periodic array can be expanded in a Fourier series:

$$A(x,z=0) = \sum_{m=-\infty}^{\infty} a_m \exp(2\pi j m x/d), \tag{1}$$

where $a_m$ are the complex weights of the Fourier components and d is the aperture spacing. The free-space transfer function is given by $$H(m,z) = exp(2\pi j z/\lambda) \, exp(-j\lambda z m^2/d^2), \tag{2}$$

where z is the propagation distance, $\lambda$ is the wavelength of light, and m is an integer. The field A(x,z) at a distance z from the array is given by multiplying each Fourier component $a_m$ by the proper phase delay H(m,z). Propagation of a distance $z_t = 2d^2/\lambda$ reduces H(m,z) to a constant phase for all values of m. Apart from this constant phase, the distribution at this so-called Talbot plane is identical to the original near field of the laser, and hence corresponds to a self-image; additional self-images occur at integer multiples of zt. By choosing the round trip laser cavity length equal to a Talbot distance, the feedback light is coupled efficiently into the laser waveguides.

For a round trip cavity length of one-half a Talbot distance $(z=d^2/\lambda)$ the free-space transfer function becomes $$H(m=z_t/2) \, exp(2\pi j d^2/\lambda^2) \, exp(-\pi j m^2). \tag{3}$$

Ignoring the constant phase term again, and recognizing that $exp(-j\pi m^2) = exp(-j\pi m)$ for integer m, the new amplitude distribution becomes $$\begin{aligned} A(x, z_t/2) &= \sum_{m=-\infty}^{\infty} a_m \exp(2\pi j m x/d) \exp(-\pi j m) \\ &= \Sigma \, a_m \exp[2\pi j m(x - d/2)/d]. \end{aligned} \tag{4}$$

This amplitude distribution is identical to the original near field of Eq. (1), but shifted by one-half period (d/2). Feedback light from an array lasing in the fundamental lateral mode is imaged exactly in between the apertures, resulting in higher cavity loss.

Next, we consider the field distribution of the fundamental mode at one-quarter Talbot distance $(z=d^2/2\lambda)$. This distribution corresponds to a coherent superposition of two Talbot images: the first is a registered self-image and the second is a self-image shifted by one-half period (d/2) The two images differ in phase by $\pi/2$ radians.

We now consider the self-imaging properties of the highest-order lateral mode. This mode is characterized by a $\pi$ phase reversal at every lasing aperture. Again, the laser apertures are assumed to be spaced by a distance d, but the period of the distribution is now 2d and all even harmonics of the Fourier series are zero. The field at the lasing aperture and the Fresnel transfer function are given by $$a(x,z=0) = \sum_{m=-\infty}^{\infty} a_m \exp(2\pi jmx/2d) \; (m \text{ odd}), \quad (5)$$

and $$H(m,z) = \exp(2\pi jz/\lambda) \exp(-\pi jz\lambda m^2/4d^2).$$

We first calculate the field at the half-Talbot plane $z = d^2/\lambda$. The Fresnel transfer function becomes (ignoring the constant phase)

$$H(m, z = d^2/\lambda) = \exp(-\pi j m^2/4), \; (m \text{ odd integer}). \quad (7)$$

Since m is odd only, we have $m = (2p-1)$, where p is any integer. The transfer function then becomes $$H(p, z = d^2/\lambda) = \exp[-j(2p-1)^2/4] = \exp[-\pi jp(p-1)] \exp(-\pi j/4). \quad (8)$$

Since p is an integer, either p or (p−1) is even, and Eq. (8) therefore reduces to a constant phase term. For the highest-order mode we conclude that registered self-images are produced at all integer multiples of a half-Talbot distance.

Finally, the field distribution of the highest-order mode at one-quarter of a Talbot distance ($z = d^2/2\lambda$) is considered. As in the fundamental mode case, the distribution consists of the superposition of two self-images. In this case, however, one image is shifted by one-quarter period to the left of the original, and the other is shifted one-quarter period to the right. The phase of each new image is equal to the phase of the original aperture.

We can now explain the lateral mode selection due to diffractive coupling shown in FIG. 2. The threshold is affected by both the divergence of light perpendicular to the array and the Talbot self-imaging properties of the light parallel to the array. Since the flat output mirror does not refocus the light perpendicular to the array, the thresholds increased with increasing mirror distance. This effect can be eliminated in a real system by using a two-dimensional array or a cylindrical output mirror. Talbot self-imaging effects separate the two curves.

For the particular lenslets used in Lincoln Laboratory experiment, the highest-order mode is composed almost entirely of two symmetric plane waves (see FIG. 2), and has a correspondingly large depth of field for Talbot imaging. Its threshold curve is dominated by diffraction loss transverse to the aperture, and shows little effect of self-imaging. The fundamental mode has 20% of its power in off-axis orders, and is therefore affected by the self-imaging properties of the array: it exhibits a higher threshold for round trip cavity lengths less than a Talbot distance (6.2 mm), and lower threshold for round trip cavity lengths greater than a Talbot distance. The greater threshold in the half-Talbot region is expected, since the self-image of the fundamental mode is shifted by one-half period, resulting in larger coupling losses to the laser waveguides. The thresholds of the two modes are equal at a full Talbot distance, since both modes form self-images at this distance.

Finally, the two threshold curves exhibit small peaks at approximately one-quarter of a Talbot distance (1.5 mm), With the fundamental mode resulting in the lower threshold. This can be explained by noting that the fundamental mode produces a doubled image in this plane. Half of the light is registered properly for coupling to the laser waveguides. The highest-order mode produces a shifted double image with a null occurring in the center of the laser waveguide, thereby raising its threshold with respect to the fundamental mode. These results are in good agreement with theoretical and experimental work performed on monolithic structures.

It is noted that using lenses which result in a smaller fill factor will enhance the Talbot effect by increasing the losses at non-self-imaging planes. The corresponding curves shown in FIG. 2 will be separated by a greater amount in this case.

C

The Apparatus

Summarizing the above, the thresholds of the fundamental and highest-order modes of an AlGaAs laser array were measured as a function of external cavity length. The array was shown to lase in the mode with the lowest threshold. This mode changed from the fundamental to highest-order and back to the fundamental mode as the cavity length was increased. The behavior of these three regions is explained by the self-imaging properties of the array at fractional Talbot planes.

Two embodiments of the invention were found suitable to achieve lateral mode control, and hence for producing a single-lobed far-field diffraction pattern.

Figure 3:
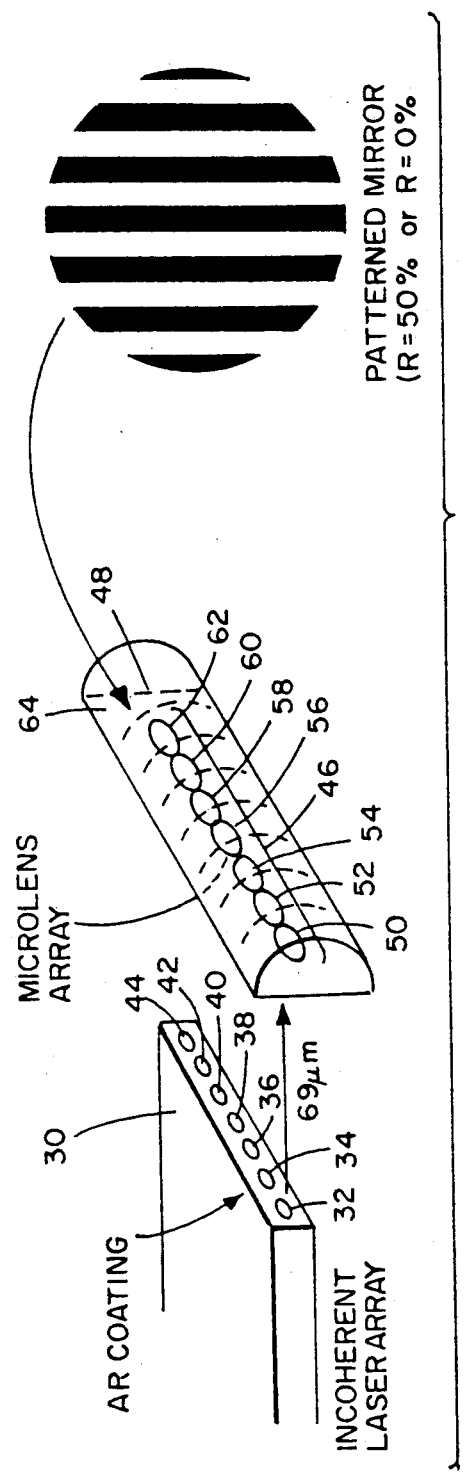
FIG. 3 is an diagrammatic view of one embodiment of the laser combining system of the invention.

One embodiment is illustrated by FIG. 3. A laser array 30 includes individual semiconductor lasers 32–44 spaced a distance d apart. In the present demonstration, $d = 50 \, \mu m$. The output facets of the lasers are provided with an antireflection coating. Suitable lasers are AlGaAs diode lasers made by Spectra Diode Laboratory which operate at a wavelength of 0.8 $\mu m$. It will be appreciated by those skilled in the art that the number of lasers shown in FIG. 3 is entirely exemplary and that an array would generally include many more lasers. In addition, other types of lasers could be used at other wavelengths (e.g., InGaAsP at 1.3 $\mu m$). In the present demonstration, a one-dimensional laser array consisting of seven gain-guided multiple-quantum-well lasers was utilized in experiments at the Lincoln Laboratory of the Massachusetts Institute of Technology, but the concept can be extended to hundreds of lasers in two dimensions. A microlens array 46 is interposed to intercept the beams. The lenslet array 46, to be described in more detail in conjunction with FIG. 4 below, collimates each of the individual beams. After collimation, a portion of the light is reflected from a partially reflecting feedback mirror 64 and another portion is transmitted or absorbed.

Figure 4:
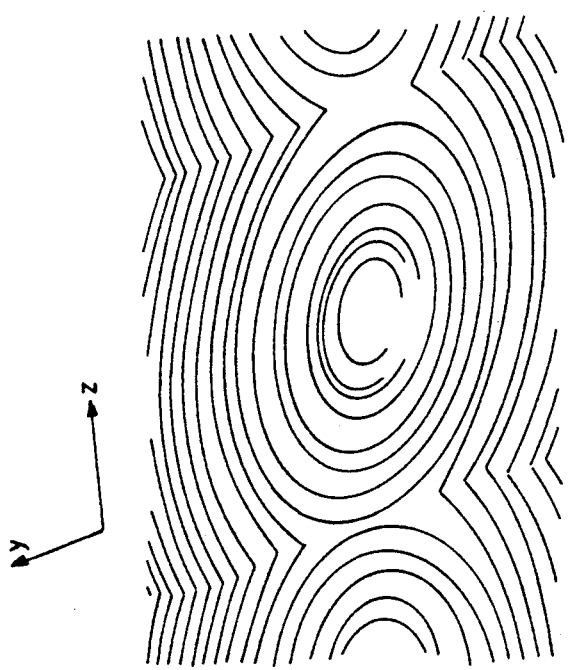
FIG. 4 is a scanning electron photomicrograph of the central region of an anamorphic microlens array used in one embodiment of the invention.

The lenses 50–62 in the lenslet array 46 have a separation equal to the laser spacing and are of a size and shape to at least partially reduce gaps between lasers, increasing the fill factor of the array. The advantages of increasing the fill factor are: 1) a reduction in edge effects in the Talbot image; 2) a reduction in the sensitivity to end mirror placement; and 3) a reduction of side lobes in the far field. A low array fill factor, however, discriminates more between the fundamental and highest-order modes. The actual lens size, and hence fill factor, is a compromise to balance these effects. The fill factor can be increased to 100% outside the laser cavity by an additional set of lenses placed outside of the laser cavity. FIG. 4 is a scanning electron microscope photograph of a portion of the array 46 showing lenses with abutting rectangular apertures.

The focal length of the lenses is chosen to optimize this fill factor. The lenses must also have low aberrations to achieve near diffraction-limited performance. In addition, it may be desirable to introduce some wavefront correction in the lenses to compensate for aberrations in the individual lasers. Finally, the lenses should not introduce significant loss. Since the lenslet arrays are made by photolithography and reactive ion etching (described below), the individual lenses can be made to satisfy all of the above requirements.

In the Lincoln Laboratory experiment, the external cavity 48 was fabricated from a single piece of fused silica. The thickness of the cavity was chosen to be $nd^2/\lambda = 4.5$ mm, where n = 1.45 is the refractive index of the substrate. The optimum reflectivity can be chosen to maximize laser output. In the Lincoln Laboratory experiment, an output mirror with 50% reflectance was deposited on the back side of the substrate. The Talbot effect produced a self-image of the array in the periodic direction (parallel to the array). Transverse to the array, the curvature of the substrate (radius of curvature = 5.0 mm focused the light back into the diode laser waveguides.

In the present demonstration, a lens spacing of 50 microns was chosen to match the spacing of the lasers in the laser array 30. The focal length was chosen to be 100 microns in the direction lateral to the array (x axis) so that the diffracted beams from individual lasers would just fill the lenslets. This resulted in an f/2 lens lateral to the array because of the 50 micron lens width in the x direction. To compensate for the 1.23 waves of astigmatism measured from the gain-guided lasers, the transverse focal length (y-axis) was chosen to be 69 microns. This anamorphic lens resulted in the elliptical Fresnel zone patterns shown in FIG. 4. The eccentricity of the elliptical patterns was 0.37. By choosing the height of the lenses to be 69 microns, a lens speed of f/1 was achieved transverse to the laser array (y-axis). By locating the lenslet array 46 approximately 69 microns from the laser array 30, the beams from the lasers just filled each of the lenses in the array 46. By virtue of the microlenses, the one-dimensional fill-factor (ratio of the effective laser aperture to the laser spacing) increased from approximately to 80%.

Figure 5:
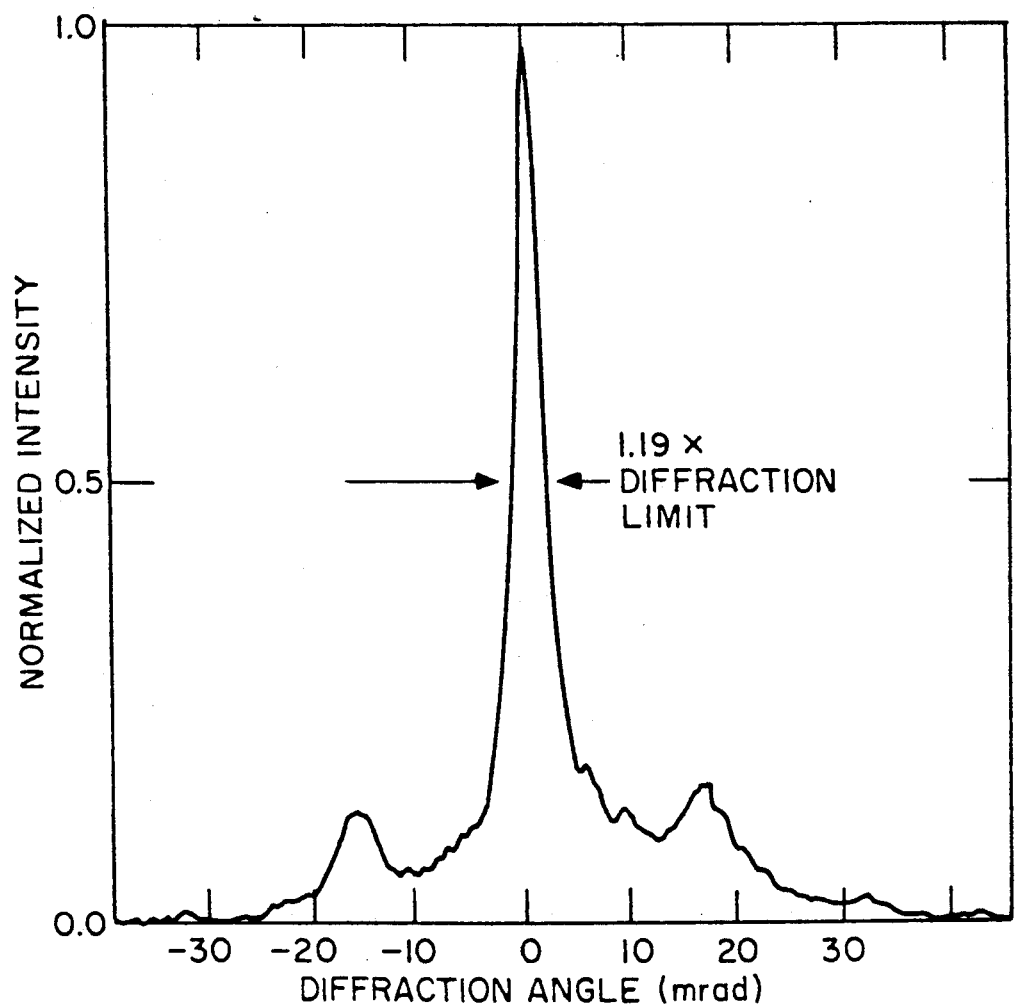
FIG. 5 is a graph of the far-field pattern from the laser array using one embodiment of the invention.

In this embodiment, the imaging properties of the Talbot cavity at one-half of a Talbot distance ($Z_t/2$) were utilized. A correctly registered self-image is produced at $Z_t/2$ for the highest-order lateral mode, whereas the fundamenlal lateral mode is shifted by one-half period. The output mirror 64 (located at $Z_t/2$) was patterned to reflect light with a half-period shift corresponding to the fundamental mode. Light from the highest-order lateral mode suffers increased loss, since it passes through the nonreflecting portions of the mirror 64 (and hence is either transmitted or absorbed by the mirror), and the mode is prevented from lasing. FIG. 5 shows the far field pattern from this cavity. The central peak has a divergence corresponding to 1.19× the diffraction limit, with 67% of the far-field power contained in the central lobe.

Figure 6:
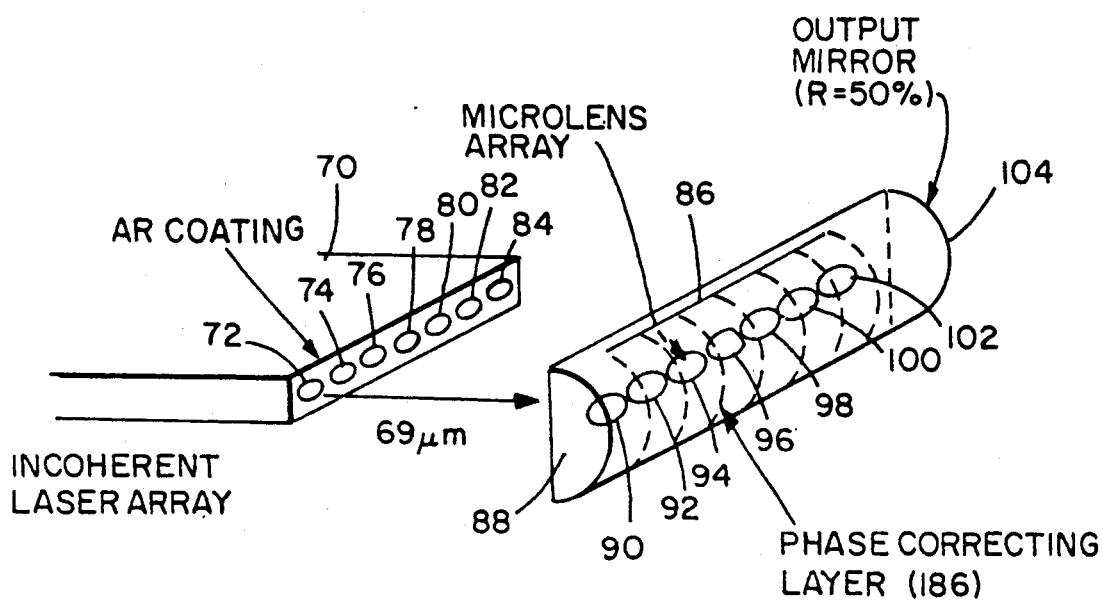
FIG. 6 is an diagrammatic view of another embodiment of the laser combining system of the invention.

Another aspect of the invention is illustrated by FIG. 6. A laser array 70 includes individual semiconductor lasers 72–84 spaced a distance d apart. In the present demonstration, d = 50 μm. The output facets of the lasers are provided with an antireflection coating. Suitable lasers are AlGaAs diode lasers made by Spectra Diode Laboratory which operate at a wavelength of 0.8 μm. It will be appreciated by those skilled in the art that the number of lasers shown in FIG. 6 is entirely exemplary and that an array would generally include many more lasers. In addition, other types of lasers could be used at other wavelengths (e.g., InGaAsP at 1.3 μm). In the present demonstration, a one-dimensional laser array consisting of seven gain-guided multiple-quantum-well lasers was utilized in experiments at the Lincoln Laboratory of the Massachusetts Institute of Technology, but the concept can be extended to hundreds of lasers in two dimensions. A microlens array 86 is interposed to intercept the beams. The lenslet array 86, to be described in more detail in conjunction with FIG. 7 below, collimates each of the individual beams. After collimation, a portion of the light is reflected from a partially reflecting feedback mirror 104 and another portion is transmitted.

Figure 7:
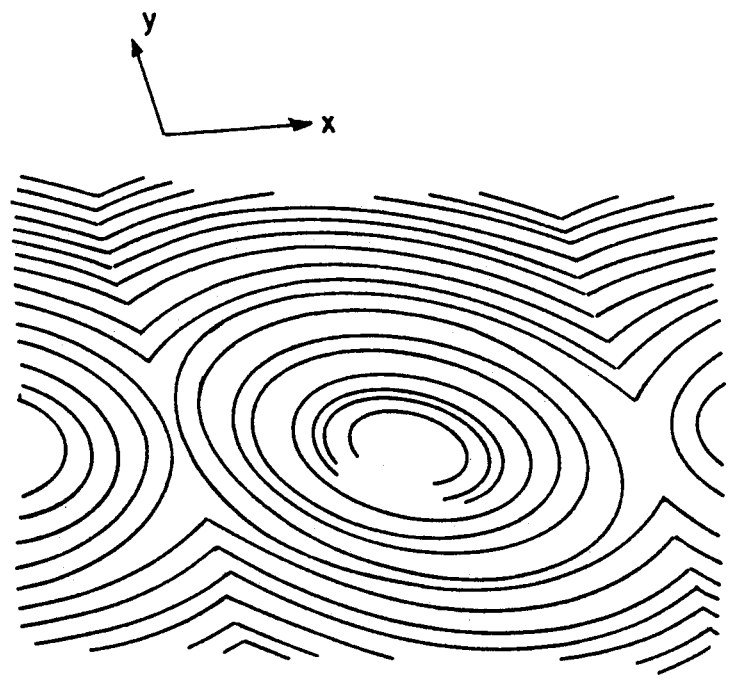
FIG. 7 is a scanning electron photomicrograph of the central region of an anamorphic microlens array used in another embodiment of the invention.

The lenses 90-102 in the lenslet array 86 have a separation equal to the laser spacing and are of a size and shape to at least partially reduce gaps between lasers, increasing the fill factor of the array. The advantages of increasing the fill factor are: 1) a reduction in edge effects in the Talbot image; 2) a reduction in the sensitivity to end mirror placement; and 3) a reduction of side lobes in the far field. A low array fill factor, however, discriminates more between the fundamental and highest-order modes. The actual lens size, and hence fill factor, is a compromise to balance these effects. The fill factor can be increased to 100% outside the laser cavity by an additional set of lenses placed outside of the laser cavity. FIG. 7 is a scanning electron microscope photograph of a portion of the array 86 showing lenses with abutting rectangular apertures.

The focal length of the lenses is chosen to optimize this fill factor. The lenses must also have low aberrations to achieve near diffraction-limited performance. In addition, it may be desirable to introduce some wavefront correction in the lenses to compensate for aberrations in the individual lasers. Finally, the lenses should not introduce significant loss. Since the lenslet arrays are made by photolithography and reactive ion etching (described below), the individual lenses can be made to satisfy all of the above requirements.

In the Lincoln Laboratory experiment, the external cavity 88 was fabricated from a single piece of fused silica. The thickness of the cavity was chosen to be slightly less than $nd^2/\lambda = 4.5$ mm, where n = 1.45 is the refractive index of the substrate. An output mirror with 50% reflectance was deposited on the back side of the substrate. The Talbot effect produced a self-image of the array in the periodic direction (parallel to the array). Transverse to the array, the curvature of the substrate (radius of curvature = 5.0 mm) focused the light back into the diode laser waveguides.

In the present demonstration, a lens spacing of 50 microns was chosen to match the spacing of the lasers in the laser array 70. The focal length was chosen to be 100 microns in the direction lateral to the array (x axis) so that the diffracted beams from individual lasers would just fill the lenslets. This resulted in an f/2 lens lateral to the array because of the 50 micron lens width in the x direction. To compensate for the 1.23 waves of astigmatism measured from the gain-guided lasers, the transverse focal length (y-axis) was chosen to be 69 microns. This anamorphic lens resulted in the elliptical Fresnel zone patterns shown in FIG. 7. The eccentricity of the elliptical patterns was 0.37. By choosing the height of the lenses to be 69 microns, a lens speed of f/1 was achieved transverse to the laser array (y-axis). By locating the lenslet array 86 approximately 69 microns from the laser array 70, the beams from the lasers just filled each of the lenses in the array 86. By virtue of the microlenses, the one-dimensional fill-factor (ratio of the effective laser aperture to the laser spacing) increased from approximately to 80%.

Figure 8:
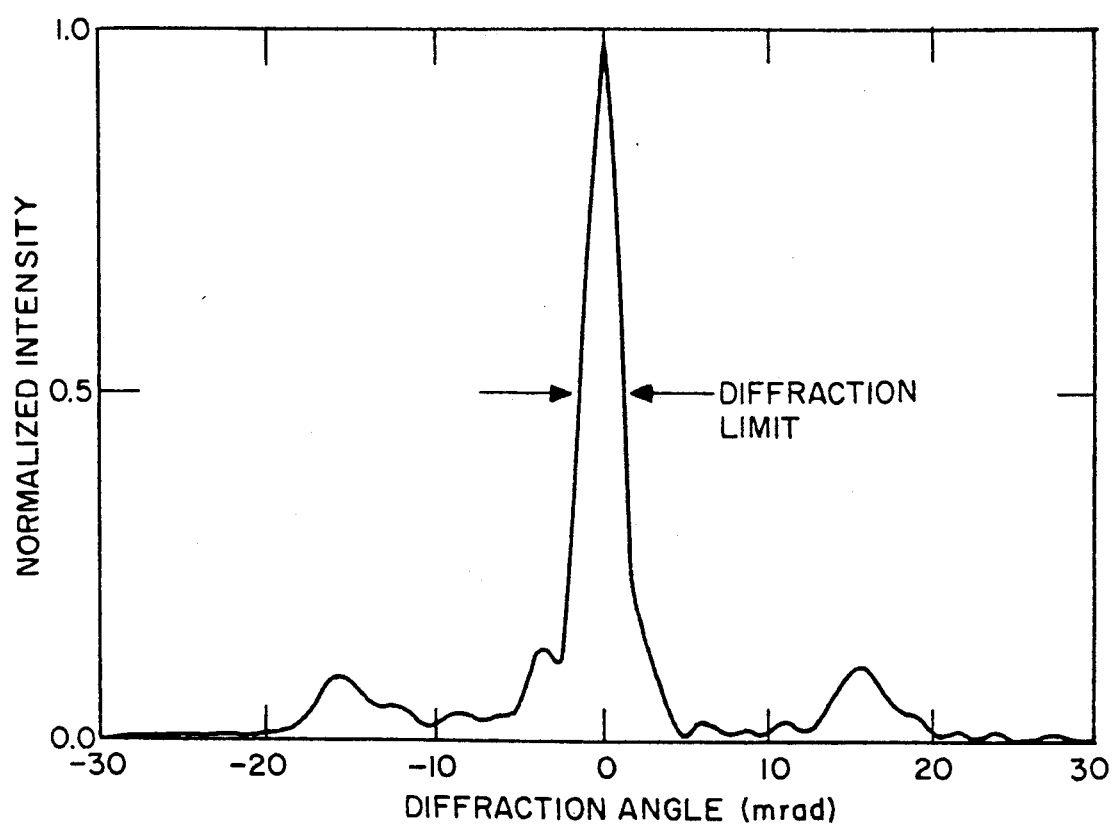
FIG. 8 is a graph of the far-field pattern from the laser array using another embodiment of the invention.
Figure 9:
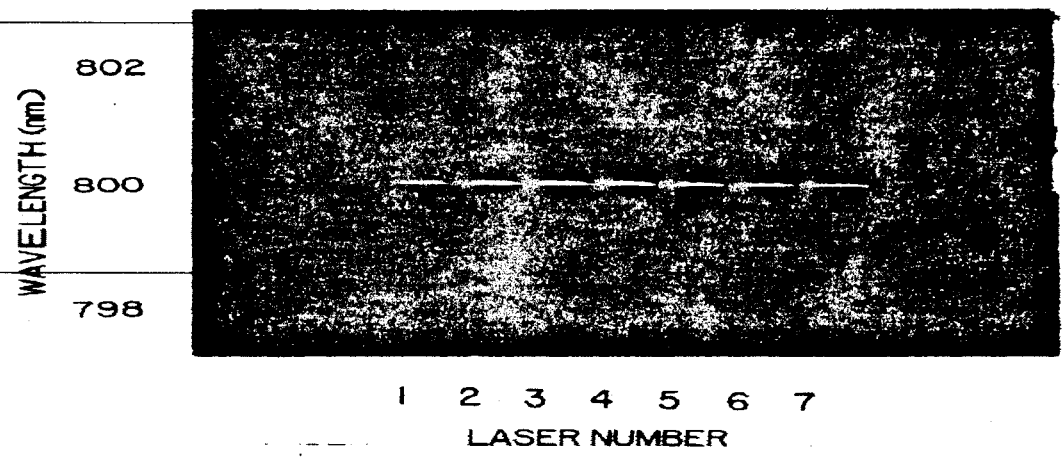
FIG. 9 is a photograph of the spectrally resolved near-field of the seven-stripe laser array.

In one embodiment of this aspect of the invention, the external cavity 88 has a round-trip cavity length less than a Talbot distance. A round-trip length of one-half the Talbot distance is theoretically preferred. However, any length can be used where the highest-order mode has a lower threshold than the fundamental mode (see FIG. 2). When the cavity has a lower threshold for the highest-order lateral mode, a double-lobed far-field pattern results. A mode correction phase plate 106 is fabricated on top of the mirror 104 to convert this highest-order mode into the fundamental single-lobed mode. The phase plate was fabricated by spinning a half-wave layer of photoresist on top of the dielectric mirror, and applying a pattern to shift the phase of every other aperture. The resulting far-field pattern is shown in FIG. 8. The diffraction-limited central peak was 2.7 mrad wide (Full Width at Half Maximum), and contained 80% of the far-field power. The spectrally resolved near-field is shown in FIG. 9. All seven emitters are seen to lase on the same single longitudinal mode.

In another embodiment of this aspect of the invention, the external cavity 88 has a round-trip cavity length greater than a Talbot distance. Any length can be used where the highest-order mode has a higher threshold than the fundamental mode (see FIG. 2). When the cavity has a lower threshold for the fundamental mode, a single-lobed far-field pattern automatically results. In this embodiment, a mode correction phase plate 106 is unnecessary and may be deleted.

A diffractive microlens is constructed by subtracting integral numbers of wavelengths from the lens transmittance function so that the resulting phase function is constrained between 0 and $2\pi$. In the present demonstration, the transmittance function of the anamorphic lens was given by $$z(r,\Theta) = exp[jkf_1]exp[-jk(f_1^2+r^2)^{\frac{1}{2}} - j(k/2f_2) \, r^2\sin^2\Theta] \quad (9),$$

where k is the wavenumber of the light, $f_1$ is the focal length of a circularly symmetric lens (100 microns), and $f_2$ is the focal length of a cylindrical lens parallel to the lens array (222 microns). The focal length of the combined lenses transverse to the array is 69 microns. Note that the first term in the exponential represents a perfect collimating lens and so does not have the spherical aberration associated with spherical lenses. The second term represents pure astigmatism with a quadratic phase curvature chosen to cancel the laser astigmatism. Any combination of aberration correction terms can of course be used to produce a general single element aspheric lens.

The etched lens pattern consists of a quantized version of the phase transmittance in equation (9). The boundaries between the etch levels of a binary lens (two phase levels) are given by the locus of points (r,$\Theta$) which satisfy the equation $$k(f_1^2+r^2)^{\frac{1}{2}} + (k/2f_2) \, r^2\sin^2\Theta = n\pi + kf_1 \quad (10)$$

for various values of the integer n. These points form Fresnel zones which are nearly elliptical in shape.

The diffraction efficiency of the simple binary diffractive lens in equation (10) is 40.5%. This efficiency can be increased by etching multiple levels to better approximate equation (9). (See U.S. patent application Ser. No. 99,307 entitled "High Efficiency Multi-level Diffractive Optical Elements," by G. Swanson and W. Veldkamp). It can be shown that the diffraction efficiency of a multilevel diffractive lens is given by $$\eta = \frac{\sin(\pi/N)}{\pi/N} \quad (11)$$

where N is the number of etched phase levels.

In the present demonstration, four etch levels were fabricated, corresponding to a theoretical lens diffraction efficiency $\eta = 81\%$. Equation (10) was modified to describe the etch levels of each etch mask p (p=1,2):

$$k(f_1^2+r^2)^{\frac{1}{2}} + (k/2f_2) \, r^2\sin^2\Theta = n\pi/m + kf_1 \quad (12)$$

where $m = 2(p-1)$. Equation (12) can be applied to any number of masks (p) and etch levels (m).

The diffractive anamorphic microlens array described here was fabricated completely by mask-and-etch techniques used in producing integrated electronics circuits. High quality aspheric lenses of arbitrary size and shape can be fabricated with this method. In addition, large arrays of lenses can be produced as easily as single lenses.

Figure 10:
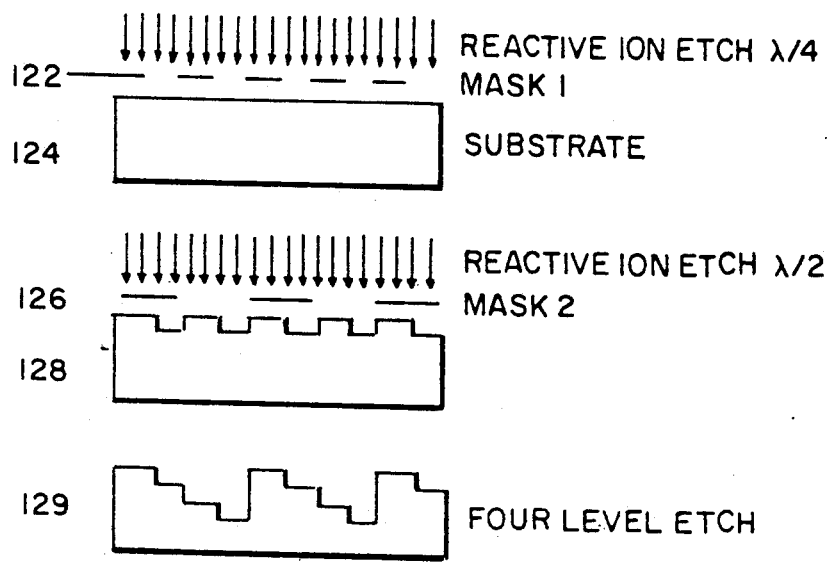
FIG. 10 illustrates the fabrication steps necessary to produce a four level diffractive lens.
Figure 11:
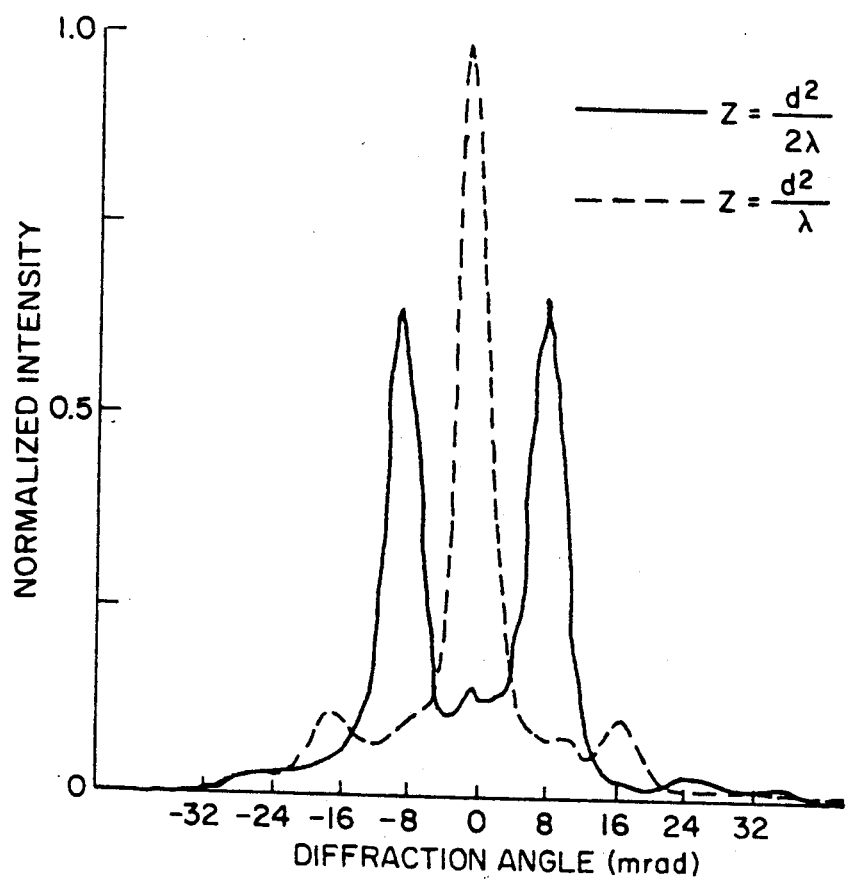
FIG. 11 is a graph of the far-field pattern from an array of lasers operating in fundamental mode (dashed curve) and highest-order mode (solid curve).

Fabrication took place in three stages: (i) computer-aided design and generation of a master mask, (ii) transferring the mask pattern onto the lens substrate using photolithography, and (iii) etching the pattern into the substrate material. Two master masks were produced corresponding to the two etching steps of the four-level lens. The master masks were replicated by vacuum-contact photolithography onto thin chromium-coated glass plates (flex masks). These flex masks were used to expose a layer of photoresist on a chromium-coated quartz substrate by vacuum contact photolithography. The mask with the smallest features was printed first. After photoresist development the exposed chromium was wet-etched, leaving a patterned etch stop 122 on the substrate 124 shown diagrammatically in FIG. 10. The substrate was reactive-ion etched to a depth corresponding to a phase retardation of one-quarter wavelength using $CHF_3$, after which the etched substrate 128 was recoated with photoresist, and the second mask 126 (large features) was aligned to the etched pattern on the substrate. After etching to remove exposed chromium, the substrate was reactive-ion etched to a depth corresponding to a phase retardation of one-half wavelength. The resulting four-level etch profile 129 has a theoretical diffraction efficiency of 81%. Measured diffraction efficiencies of the four level lens shown in FIGS. 4 and 7 ranged from 70% across an f/2 region of the lens to 80% in the central f/4 region. Higher diffraction efficiencies can be obtained by using a larger number of etch levels. For example, 16 levels (corresponding to 4 etches) produces a diffraction efficiency of 98.7%.

The laser beam addition technique of the present invention is applicable to two-dimensional arrays as well.

The optical apparatus of the present invention combines the output of multiple lasers to produce a coherent beam having a single-lobed, far-field pattern. Coherence is achieved by diffractive coupling, the high efficiency of which is ensured by separating the lenslet array from the feedback mirror a predetermined fraction of the Talbot distance. Further, the apparatus makes use of the Talbot effect in the design of a cavity allowing selection and control of the operating lateral mode.

It is recognized that modifications and variations of the present invention will occur to those skilled in the art and it is intended that all such modifications and variations be included within the scope of the appended claims.

What is claimed is:

1. An apparatus for coherent beam combining and for lateral mode control of an array of lasers comprising a miniature Talbot cavity formed between said array and a surface spaced apart from said array by a distance $Z=nd^2/\lambda$ where n is a nonnegative integer, $\lambda$ is the wavelength of the lasers, and d is the laser aperture spacing in said array, said surface being divided into partially reflecting and non-reflecting portions, said partially reflecting portions partially reflecting only that portion of the light from said lasers having a half period shaft corresponding to a fundamental lateral mode.

2. An apparatus for coherent beam combining and for lateral mode control of an array of lasers comprising a miniature Talbot cavity formed between said array and a partially reflecting mirror spaced apart from said array by a distance Z, such that $nd^2/\lambda < Z < (n+1)d^2/\lambda$ where n is a nonnegative integer, $\lambda$ is the wavelength of the lasers, and d is the laser aperture spacing in said array.

3. An apparatus for coherent beam combining and for lateral mode control of an array of lasers comprising a miniature Talbot cavity formed between a lenslet array positioned to receive light from said lasers and a surface spaced apart from said lenslet array by a distance $Z=nd^2/\lambda$ where n is a nonnegative integer, $\lambda$ is the wavelength of the lasers, and d is the laser aperture spacing in said laser array, said surface being divided into partially reflecting and non-reflecting portions, said partially reflecting portions partially reflecting only that portion of the light from said lasers having a half period shift corresponding to a fundamental lateral mode.

4. An apparatus for coherent beam combining and for lateral mode control of an array of lasers comprising a miniature Talbot cavity formed between a lenslet array positioned to receive light from said lasers and a partially reflecting mirror spaced apart from said lenslet array by a distance Z, such that $$nd^2/\lambda < Z < \frac{(n+1)}{2} d^2/\lambda$$

where n is a nonnegative integer, $\lambda$ is the wavelength of the lasers, and d is the laser aperture spacing in said laser array.

5. The apparatus of claim 3 or 4, wherein each of the lenslets in said lenslet array is a diffractive lens.

6. The apparatus of claim 5, wherein each of the lenslets in said lenslet array is a multistep diffractive lens.

7. The apparatus of claim 6 including four steps.

8. The apparatus of claim 5, wherein the lenslets include laser wavefront aberration correction.

9. The apparatus of claim 8, wherein the lenslets include elliptical Fresnel zone patterns for astigmatic correction.

10. The apparatus of claim 1 or 2, wherein the laser array is one-dimensional.

11. The apparatus of claim 1, wherein the laser array is two-dimensional.

12. The apparatus of claim 2, wherein the laser array is two-dimensional.

13. The apparatus of claim 11, wherein the ratio of the square of the laser spacings in the two dimensions forms a rational number expressed by the ratio of two integers.

14. The apparatus of claim 11, wherein the laser spacings in the two dimensions are integer multiples of one another.

15. The apparatus of claim 1, wherein said non-reflecting portions of said mirror permit transmission through the mirror of light incident on said non-reflecting portions.

16. The apparatus of claim 1, wherein said non-reflecting portions of said mirror permit absorption by the mirror of light incident on said non-reflecting portions.

17. The apparatus of claim 2, further including adapted to include a mode correction phase plate to convert a far-field diffraction pattern from that of a highest-order lateral mode to that of a fundamental lateral mode.

18. The apparatus of claim 17, wherein said phase plate is deposited on said mirror on the side of said mirror exterior to the Talbot cavity.

19. The apparatus of claim 18, wherein said phase plate comprises one single rectangular pattern for each of said lasers.

20. The apparatus of claim 2, wherein an external phase correcting plate is used to convert a far-field diffraction pattern from that of a highest-order lateral mode to that of a fundamental lateral mode.

21. The apparatus of claim 10, wherein said second surface is of cylindrical shape, whereby said mirror is also cylindrical, the radius of curvature of said cylindrical shape chosen so as to focus light normal to said laser array back into said array.

22. The apparatus of claim 2, wherein said distance Z is chosen such that a threshold current for laser operation in fundamental lateral mode is lower than a threshold current for operation in highest-order mode.

23. The apparatus of claim 1 or 2, wherein a lenslet array external to the miniature cavity is added to increase the fill factor and reduce the far-field side lobes.

* * * * *

UNITED STATES PATENT AND TRADEMARK OFFICE
CERTIFICATE OF CORRECTION

PATENT NO. : 5,027,359
DATED : June 25, 1991
INVENTOR(S) : James R. Leger and Gary J. Swanson It is certified that error appears in the above-indentified patent and that said Letters Patent is hereby corrected as shown below:

Column 4, line 29: in the equation (2), delete "$(-j\lambda zm^2/d^2)$" and insert therefor -- $(-\pi j\lambda zm^2/d^2)$ --;

Column 4, line 41: delete "zt" and insert therefor -- $z_t$ --;

Column 5, line 28: in the equation (8), delete "exp[-j(2p-1)" and insert therefor -- exp[-$\pi$j(2p-1) --;

Column 6, line 7: delete "With" and insert therefor -- with --;

Column 7, line 54: after "approximately" please insert -- 6% --;

Column 9, line 16: after "approximately" please insert -- 6% --;

Column 10, line 30: delete "m=2(p-1)" and insert therefor -- $m=2^{(p-1)}$ --;

Column 11, line 36: delete "shaft" and insert therefor -- shift --; and

Column 12, line 41: delete "adapted to include".

Signed and Sealed this

Twenty-fifth Day of January, 1994

Attest:

BRUCE LEHMAN

*Attesting Officer*        *Commissioner of Patents and Trademarks*